United States Patent [19]

Schelten

[11] Patent Number: 4,918,316
[45] Date of Patent: Apr. 17, 1990

[54] METHOD OF AND APPARATUS FOR IRRADIATING LARGE SURFACES WITH IONS

[75] Inventor: Jakob Schelten, Jülich, Fed. Rep. of Germany

[73] Assignee: Kernforschungsanlage Julich Gesellschaft mit beschrankter Haftung, Julich, Fed. Rep. of Germany

[21] Appl. No.: 257,103

[22] Filed: Oct. 12, 1988

[30] Foreign Application Priority Data

Oct. 12, 1987 [DE] Fed. Rep. of Germany ....... 3734442

[51] Int. Cl.$^4$ ............................................ H01J 37/147
[52] U.S. Cl. .............................. 250/398; 250/396 R; 250/492.3
[58] Field of Search ........... 250/492.21, 492.2, 396 R, 250/398

[56] References Cited

U.S. PATENT DOCUMENTS

| | | | |
|---|---|---|---|
| 3,845,312 | 10/1974 | Allison, Jr. | 250/398 |
| 4,002,912 | 1/1977 | Johnson | 250/396 R |
| 4,013,891 | 3/1977 | Ko et al. | 250/492.21 |
| 4,128,764 | 12/1978 | Luce | 250/398 |
| 4,224,523 | 9/1980 | Crean | 250/398 |
| 4,321,470 | 3/1982 | Kaplan et al. | 250/398 |
| 4,472,636 | 9/1984 | Hahn | 250/492.2 |
| 4,494,005 | 1/1985 | Shibata et al. | 250/492.21 |
| 4,633,138 | 12/1986 | Tokiguchi et al. | 250/492.21 |
| 4,661,712 | 4/1987 | Mobley | 250/492.21 |

Primary Examiner—Bruce C. Anderson
Attorney, Agent, or Firm—Herbert Dubno

[57] ABSTRACT

A target rotated about an axis is subjected to large surface irradiation by ions which spread in the direction of the target from a focus and in which peripheral ions are reflected inwardly, preferably by an array of electrode elements of alternatingly opposite polarity so that the reflecting electrostatic field is located only at the periphery of the beam and immediately adjacent the interior of the ion reflector.

16 Claims, 3 Drawing Sheets

METHOD OF AND APPARATUS FOR IRRADIATING LARGE SURFACES WITH IONS

CROSS REFERENCE TO RELATED APPLICATION

This application is related to the commonly assigned concurrently filed copending application Ser. No. 07/256,858 based upon German application P37 34 423.4 filed Oct. 12, 1987 by Jakob SCHELTEN and Ulrich KURZ.

FIELD OF THE INVENTION

My present invention relates to a method of and to an apparatus for the irradiation of targets of large surface area with ions and, more particularly to the irradiation of such surfaces with ions in a manner so as to ensure a uniform irradiation over the entire surface.

BACKGROUND OF THE INVENTION

In the irradiation of large-surface targets, it is known to provide an ion source, from which ions are extracted by means of an extrusion system involving acceleration of the ions. The ions can then be separated by mass in a magnetic dipole and the resulting substantial monoenergetic ions from the monochromatry formed by the magnetic dipole are accelerated to form a monoenergetic beam of ions.

The monoenergetic beam of ions is generally focussed and trained upon a surface to be irradiated which is located in the ion-beam path and is rotatable about the axis of the accelerating and focussing devices.

In the past, when the focussed beam was trained upon the surface to be irradiated, it was necessary to provide a lateral movement of the rotating surface so that the focal point on the surface against which the ions were directed could be scanned or swept across the surface to provide as uniform as possible an irradiation of the surface. Current density of the beam was thereby held constant.

A disadvantage of this system is that with a constant ion irradiation dose delivered by the beam, temperature peaks can develop on the irradiated surface which can lead to undersirable diffusion and internal stress phenomena. This can only be limited in the prior art approach by a relatively low mean working temperature, i.e. limiting the current density.

OBJECTS OF THE INVENTION

It is the principal object of the present invention to provide an improved method of irradiating a target having a large surface so that it is possible to operate with a higher mean working temperature than could be utilized with conventional methods, to obtain a more homogeneous irradiation of the surface and thereby avoid the drawbacks associated with temperature peaks of the type described.

Another object is to provide an improved apparatus for irradiating a surface with an ion beam whereby prior art disadvantages are obviated.

SUMMARY OF THE INVENTION

These objects and others which will become apparent hereinafter are attained, in accordance with the present invention, by a method of irradiating a large surface with ions which comprises the steps of:

(a) generating a substantially monoenergetic beam of ions;

(b) focussing the beam at a focal point whereby the beam spreads along a path downstream from the focal point along a path having an axis and extending in a direction of movement of the ions of the beam;

(c) positioning a target provided with a large surface to be irradiated along the path distal from the focal point in a plane perpendicular to the axis and such that straight-line paths of peripheral ions of the beam divergent from the focal point intersect the plane outwardly of the surface;

(d) rotating the surface about the axis in the plane; and (e) reflecting at a location along the path of the beam between the focal point and the surface, only the peripheral ions of the beam to converge the peripheral ions upon the surface while permitting ions of the beam traveling along straight-line paths from the focal point and intersecting the plane within the surface to travel substantially unreflected to the surface.

The peripheral ions are reflected at the aforementioned location by the steps of:

($e_1$) directing the peripheral ions toward an ion reflector surrounding the beam at the location and comprised of an electrode array extending along the path of the beam and consisting essentially of a multiplicity of electrode elements elongated transversely to the direction, closely spaced in the direction and provided with mutually parallel long sides transverse to the axis, the center-to-center spacing $\lambda/2$ of successive electrode elements, where $\lambda$ is a periodicity of the electrode elements in the direction, being a minimum consistent with maintenance of electrical potentials on the elements; and ($e_2$) applying electrical potentials $\pm \Delta V$ of alternatingly opposite sign to the successive electrode elements and of a magnitude sufficient to effect reflection of peripheral ions of the beam incident upon a boundary region immediately adjacent the array as the peripheral ions approach respective electrode elements of the array.

It will be apparent that the invention utilizes the principle that the beam is focussed but the surface to be irradiated is located in the path of divergent ions from the focal point so that the ions which are directly intercepted by the surface are applied over the entire area therewith, while outermost ions of the beam, whose straight-light paths would normally cause them to bypass the surface and which intersect the plane of the rotating surface outwardly of the surface itself, are laterally reflected inwardly to provide a homogenization of the beam and therefore an especially uniform irradiation of the surface.

The ion reflector which is used a high-grade nonlinear reflector which has a minimum effect upon those ions whose straight-line paths would normally carry them from the focal point to the surface directly because the electric field which influences the beam is a maximum at the outer parameter of the lens, i.e. at the lens boundary and decays exponentially with a 1/e length from $\lambda/2\pi$ where $\lambda$ is the periodicity of the reflector, i.e. the distance between two successive electrodes of the same charge.

The field which affects the ions thus becomes vanishingly small toward the center of the beam. As a consequence, the actual reflection takes place only in a thin boundary layer immediately inwardly of the electrode array so that substantially only the peripheral ions are reflected and the remaining cross section of the ion beam is unaffected by the presence of the electrodes.

For the reflection of the ions at the reflector there is the maximum angle of incidence for impingement α at which the ions can be reflected. This maximum angle is determined by a geometry factor g and the ratio of the potential applied between the alternating electrode element of opposite polarity to the ion source potential, i.e. a potential representing the energy of the ions.

According to the invention, therefore, the ions are so focussed that the angle between the ion beam and the longitudinal, direction of the reflector does not exceed the maximum angle $\alpha_{max}$ where $$\alpha_{max} = g/2 \cdot \Delta V/U.$$

In this relationship $$g \leq 0.7$$

$\pm \Delta V$ is the electrical potential in volts applied to the electrodes and U is the electrical potential in volts corresponding to the kinetic energy eU of the ions (where e is the elementary charge, i.e. the electron charge), and the voltage usually which is applied to the ions to impart energy to them Since the beam applied to the surface to be irradiated is rotationally symmetrical with respect to the axis and the surface is rotated about this axis, only the current density of the beam in the radial direction need be altered to maintain a homogeneous irradiation dose at the surface.

The radial current density distribution can be varied, without changing the operating conditions of the reflector, by varying the focussing strength immediately upstream of the reflecting lens and thus shifting the focal point along this axis.

With a greater spread of the beam, a relatively larger proportion of the beam will be reflected while with a reduced divergence of the beam, a smaller proportion will be reflected.

With the system of the invention by a corresponding coordination of the focussing and reflection of the outer ions, I am able to achieve a highly homogeneous irradiation of the surface without the formation of temperature peaks.

Moreover I can control the system to ensure uniform irradiation of the surface by, for example, varying the focussing strength in a cyclical manner or over time to minimize the difference between the already applied radiation dose and the desired radiation dose by comparison of the measured radiation dose with a standard value, for example.

The focussing strength can thus be varied with a fixed cycling thereof with a cycle time which is short (for example, 1 second) compared with the total radiation time for the surface.

At the beginning of irradiation of a particular target, the current distribution can be measured for various focussing strengths $F_1, F_2 \ldots, F_n$, and the resulting values stored.

From the measured current distribution, utilizing a computer such as a microprocessor, any discrepancy between an already applied dose and the desired dose can be minimized in the course of irradiation. For the next cycle, the degree of focussing or the focussing strength can be modified, e.g. for the next second, and the measured current density values can be compared with the stored current distribution for continued variation of the focussing strength to ensure the desired uniform dose.

The method of the invention is applicable for any process which may utilize large-surface ion irradiation, for example ion implantation, the formation of ion mixtures and reactive ion-beam etching (see the aforementioned copending application). Apart from avoiding temperature peaks on the irradiated surface, it is possible with the present invention to operate with a higher mean working temperature. It is also an advantage that rapidly changing electrical and magnetic fields are not necessary in accordance with the invention. The conditions of space-charge compensation are constant with time so that beam instabilities are avoided. It is also an advantage that the process can be carried out even in high current and very high ion beam current installations.

According to another aspect of the invention, an apparatus for irradiating a large surface can comprise:

means for generating a substantially monoenergetic beam of ions;

means traversed by the beam for focussing the beam at a focal point whereby the beam spreads along a path downstream from the focal point along a path having an axis and extending in a direction of movement of the ions of the beam;

a target provided with a large surface to be irradiated disposed along the path distal from the focal point in a plane perpendicular to the axis and such that straight-line paths of peripheral ions of the beam divergent from the focal point intersect the plane outwardly of the surface;

means for rotating the surface about the axis in the plane; and means at a location along the path of the beam between the focal point and the surface for reflecting only the peripheral ions of the beam to converge the peripheral ions upon the surface while permitting ions of the beam traveling along straight-line paths from the focal point and intersecting the plane within the surface to travel substantially unreflected to the surface.

The means for reflecting preferably comprises:

an ion reflector surrounding the beam at the location and comprised of an electrode array extending along the path of the beam and consisting essentially of a multiplicity of electrode elements elongated transversely to the direction, closely spaced in the direction and provided with mutually parallel long sides transverse to the axis, the center-to-center spacing $\lambda/2$ of successive electrode elements, where $\lambda$ is a periodicity of the electrode elements in the direction, being a minimum consistent with maintenance of electrical potentials on the elements, and means for applying electrical potentials $\pm \Delta V$ of alternatingly opposite sign to the successive electrode elements and of a magnitude sufficient to effect reflection of peripheral ions of the beam incident upon a boundary region immediately adjacent the array as the peripheral ions approach respective electrode elements of the array.

The means for generating the substantial monoenergetic beam of ions can include:

an ion source for producing ions;

means for extracting ions from the source by accelerating the ions extracted from the source;

a magnetic dipole for separating the ions extracted from the source by ion mass to produce substantially monoenergetic ions; and means for accelerating the monoenergetic ions to form the ion beam.

The reflector can be constituted in various ways. For example, in one embodiment of the invention the electrodes of the ion reflector are constituted as rings while in another case they are rectangular frames. In still another embodiment, the electrode elements can be formed as turns of a multicoil helix, preferably a double helix.

To effect control as described above in accordance with the method aspects of the invention, a control device can be provided which allows variation of the focussing field strength in a predetermined cycling time to minimize the difference between already applied doses and a desired dose. It is conceivable that, instead of the electrostatic reflector of the invention, a magnetic reflector can be used with the same purpose.

BRIEF DESCRIPTION OF THE DRAWING

The above and other objects, features and advantages of the present invention will become more readily apparent from the following description, reference being made to the accompanying drawing in which.

SPECIFIC DESCRIPTION

Figure 4:
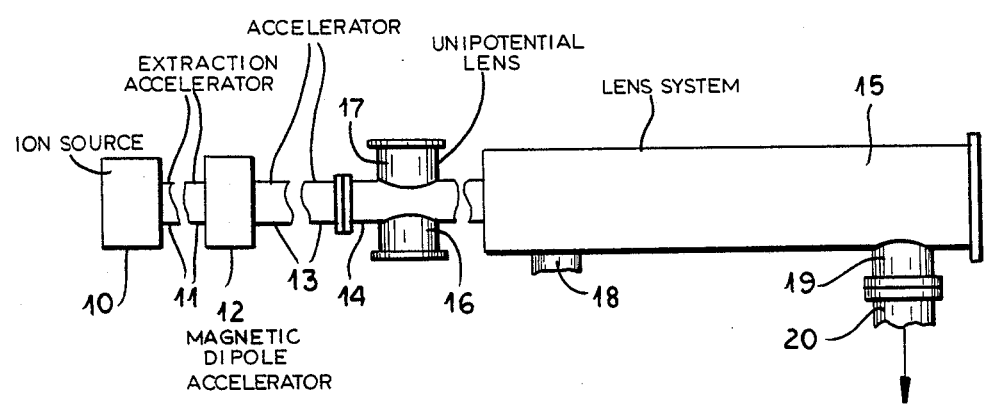
FIG. 4 is a diagrammatic elevational view of the apparatus.

Referring first to FIG. 4, it will be understood that ions can be generated at a conventional ion source 10 and extracted from this ion source by an ion accelerator 11 which is provided upstream from a magnetic dipole 12 separating the ions by ion mass; i.e. a monochromator for the ions.

Downstream of the monochromator 12 is a further accelerator 13 which generates an ion beam along an axis entering a unipotential lens 14 and provided upstream of the lens system 15 which is more fully illustrated in the remaining Figures. Flanged fittings 16, 17, 18 and 19 are provided at various points along the apparatus to allow one or more vacuum pumps to be connected to the apparatus to maintain the high vacuum required ion beam implantation. The inlet side of one pump is shown at 20 in FIG. 4.

Figure 1:
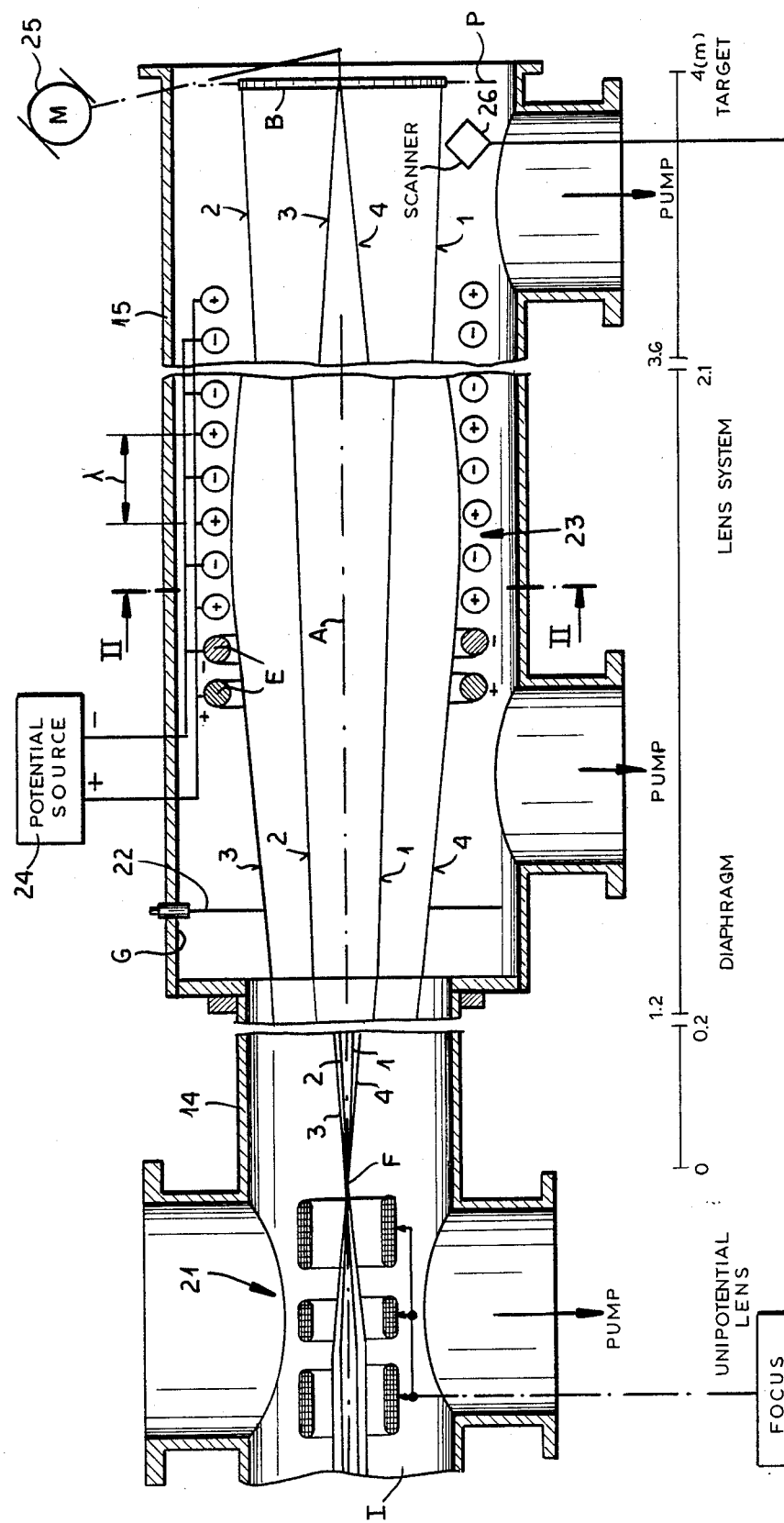
FIG. 1 is a longitudinal section through a part of an apparatus for implantation of ions in a target.

Turning to FIG. 1, in which the ion beam has been represented at I as it enters the unipotential lens 14 from the accelerator 13 along the axis A, it can be seen that the unipotential lens is provided with means 21, e.g. magnetic coils, for focussing the beam at a point F upstream of the lens system 15.

The lens system is equipped with a diaphragm 22 which can be controlled as to the diameter of the beam which is passed by this diaphragm and with a reflector represented generally at 23 for the peripheral ions of the beam.

The interior G of the lens system is evacuated as described by the pump system. The reflector 23 comprises closely spaced electrodes E which are provided with respective potentials $\Delta V$ of alternating polarity along the path of the beam by a potential source 24.

A target B is provided in a target plane P perpendicular to the Axis A and is rotated about this axis by a motor 25.

A current density detector 26, such as an array of Faraday cups, which is responsive to the radial current density and hence the radiation dose, applied to the target is connected to the focus control 27 in a feedback path to vary the focussing field strength to shift the focal point P along the axis A and thereby increase the degree of divergence of the ion beam downstream of the focal point.

The distance between the unipotential lens 14 and the implantation disk or target B is determined by the diameter of the implantation disk and the permissible angle of divergence of the ion beam. In the apparatus of FIG. 1, this is seen to be about 4 m. The disk diameter is about 300 mm and the dispersion angle $\pm 3°$.

As can be seen from FIG. 1, only the peripheral ion paths 3 and 4 are reflected by the reflector so that they are trained on the rotating surface B by virtue of the opposite potentials applied to mutually adjacent pairs of electrode elements E. The latter are as closely spaced as possible considering the potential applied to them with the spacing selected so that breakdown between electrode elements will not occur. The ion tracks 3 and 4 are those which would normally intersect the plane P outside the area of the target B. Ion tracks 1, 2 within the target area are, of course, unaffected.

Only the electrostatic field immediately adjoining the electrodes are effective to reflect the oncoming peripheral ions.

The ions, for example, can have an energy of 200 keV in which case a potential applied across the electrodes can be $\pm 50$ kV with $\lambda = 120$ mm. The thickness of the boundary region in which the ions are reflected can then be about 20 mm and the maximum field strength 5 kV/mm.

The target B is thus irradiated uniformly and by varying the strength of focus during the irradiation, for example in response to the detected irradiation of the array of Faraday cups 26 via the controller 27 in a cyclone manner as described, I can further ensure the uniform irradiation of the target.

Figure 2:
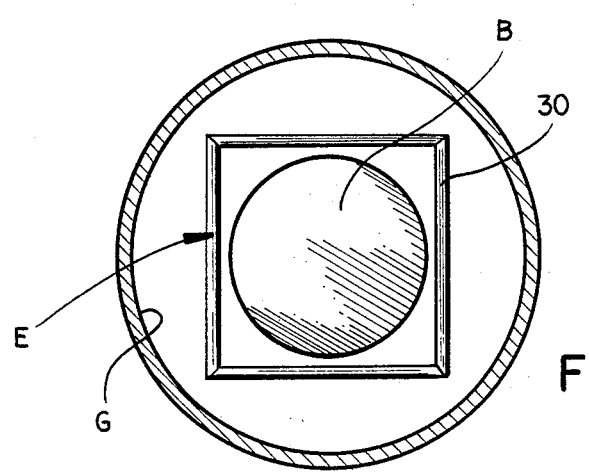
FIG. 2 is a cross section taken along the line II—II of FIG. 1.
Figure 3:
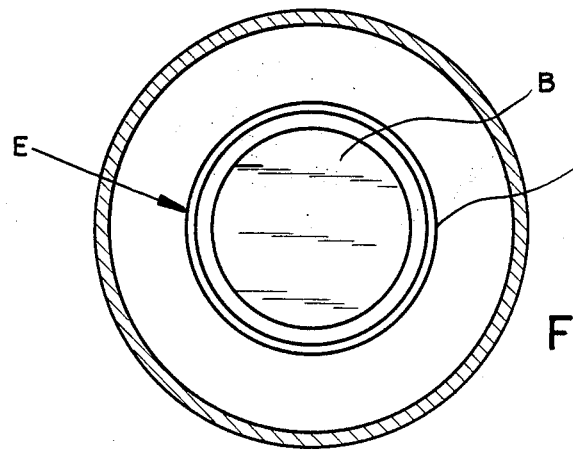
FIG. 3 is a section corresponding to FIG. 2 but illustrating another embodiment of the reflector of the invention.
Figure 5:
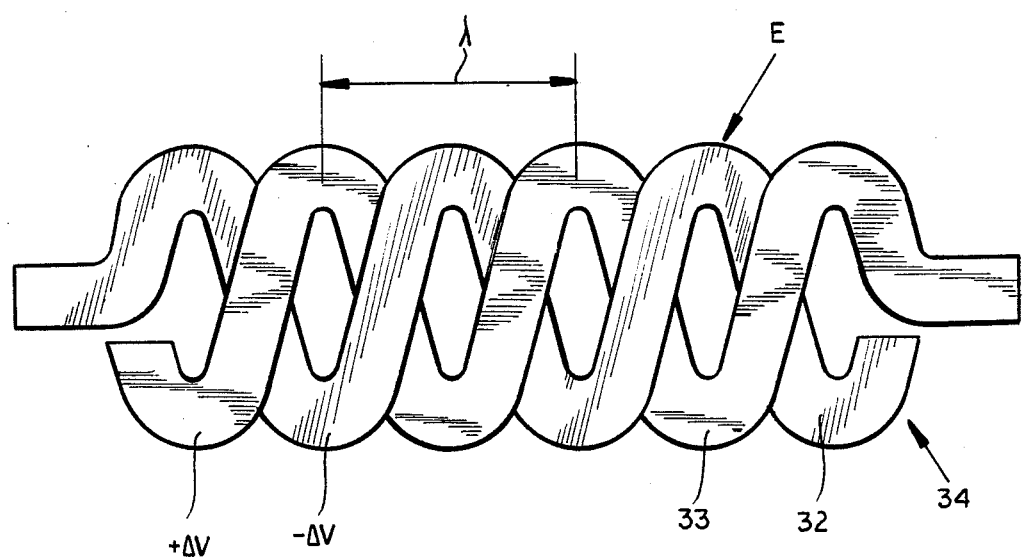
FIG. 5 is a diagrammatic elevational view of an ion reflector utilizing a double helix.

In FIG. 2 it can be seen that the electrode E may be a rectangular frame 30. Alternatively, the electrode E can be a circular ring 31 (FIG. 3). In a further alternative, best seen in FIG. 5, the electrodes E can be formed by individual turns 32 and 33 of two guides of a double helix 34.

I claim:

1. A method of irradiating a large surface with ions, comprising the steps of:
    (a) generating a substantially monoenergetic beam of ions;
    (b) focussing said beam at a focal point whereby said beam spreads along a path downstream from said focal point along a path having an axis and extending in a direction of movement of the ions of said beam;
    (c) positioning a target provided with a large surface to be irradiated along said path distal from said focal point in a plane perpendicular to the axis and such that straight-line paths of peripheral ions of said beam divergent from said focal point intersect said plane outwardly of said surface;

(d) rotating said surface about said axis in said plane; and (e) reflecting at a location along the path of said beam between said focal point and said surface, only said peripheral ions of said beam to converge said peripheral ions upon said surface while permitting ions of the beam traveling along straight-line paths from said focal point and intersecting said plane within said surface to travel substantially unreflected to said surface, and wherein said peripheral ions are reflected at said location by the steps of:

($e_1$) directing said peripheral ions toward an ion reflector surrounding said beam at said location and comprised of an electrode array extending along the path of said beam and consisting essentially of a multiplicity of electrode elements elongated transversely to said direction, closely spaced in said direction and provided with mutually parallel long sides transverse to said axis, the center-to-center spacing $\lambda/2$ of successive electrode elements, where $\lambda$ is a periodicity of said electrode elements in said direction, being a minimum consistent with maintenance of electrical potentials on said elements; and ($e_2$) applying electrical potentials $\pm\Delta V$ of alternatingly opposite sign to the successive electrode elements and of a magnitude sufficient to effect reflection of peripheral ions of said beam incident upon a boundary region immediately adjacent said array as said peripheral ions approach respective electrode elements of said array.

2. The method defined in claim 1 wherein said beam is so focussed that the angle between said straight-line paths of said peripheral ions and said array does not exceed a maximum angle $\alpha_{max}$ where:

$$\alpha_{max} = g/2 \cdot \Delta V/U,$$

wherein:
$g \leq 0.7$,
$\pm\Delta V$, and
U is an electrical potential determined by the kinetic energy
eU, and e is the elementary charge.

3. The method defined in claim 1, further comprising the step of varying the intensity of a focusing field applied to said beam in step (b) with time so as to minimize a difference between a radiation dose applied to said surface by said beam and a desired uniform application ion irradiation dose to be applied, thereby rendering treatment of said surface by said ion beam uniform.

4. The method defined in claim 3 wherein the focussing field intensity is varied in response to a comparison of the radiation dose applied to said surface with a standard value of the desired uniform application ion irradiation dose to be applied.

5. The method defined in claim 3 wherein the intensity of the focussing field applied to said beam in step (b) is varied cyclically with time and with a cycling time which is short relative to the time for irradiation of said surface to said desired uniform application ion irradiation dose.

6. The method defined in claim 1 wherein said ion beam is generated in step (a) by:

($a_1$) producing ions at an ion source;
($a_2$) extracting ions from said source by accelerating said ions extracted from said source;
($a_3$) separating the ions extracted from said source by ion mass in a magnetic dipole to produce substantially monoenergetic ions; and
($a_4$) accelerating the monoenergetic ions to form said ion beam.

7. An apparatus for irradiating a large surface with ions, comprising:

means for generating a substantially monoenergetic beam of ions;

means traversed by said beam for focussing said beam at a focal point whereby said beam spreads along a path downstream from said focal point along a path having an axis and extending in a direction of movement of the ions of said beam;

a target provided with a large surface to be irradiated disposed along said path distal from said focal point in a plane perpendicular to the axis and such that straight-line paths of peripheral ions of said beam divergent from said focal point intersect said plane outwardly of said surface;

means for rotating said surface about said axis in said plane; and means at a location along the path of said beam between said focal point and said surface for reflecting only said peripheral ions of said beam to converge said peripheral ions upon said surface while permitting ions of the beam traveling along straight-line paths from said focal point and intersecting said plane within said surface to travel substantially unreflected to said surface, and wherein said means for reflecting comprises:

an ion reflector surrounding said beam at said location and comprised of an electrode array extending along the path of said beam and consisting essentially of a multiplicity of electrode elements elongated transversely to said direction, closely spaced in said direction and provided with mutually parallel long sides transverse to said axis, the center-to-center spacing $\lambda/2$ of successive electrode elements, where $\lambda$ is a periodicity of said electrode elements in said direction, being a minimum consistent with maintenance of electrical potentials on said elements, and means for applying electrical potentials $\pm\Delta V$ of alternatingly opposite sign to the successive electrode elements and of a magnitude sufficient to effect reflection of peripheral ions of said beam incident upon a boundary region immediately adjacent said array as said peripheral ions approach respective electrode elements of said array.

8. The apparatus defined in claim 7 wherein said electrode elements lie respective planes perpendicular to said axis and surrounding the ion beam.

9. The apparatus defined in claim 8 wherein said electrode elements are individual rings.

10. The apparatus defined in claim 8 wherein said electrode elements are individual rectangular frames.

11. The apparatus defined in claim 7 wherein said electrode elements are formed as respective turns of a multicoil helix.

12. The apparatus defined in claim 11 wherein said multicoil helix is a double helix.

13. The apparatus defined in claim 7, further comprising means for varying the intensity of a focussing field applied to said beam by said means for focussing with time so as to minimize a difference between a radiation dose applied to said surface by said beam and a desired uniform application ion irradiation dose to be applied, thereby rendering treatment of said surface by said ion beam uniform.

14. The apparatus defined in claim 13 wherein said means for varying the focussing field intensity includes means responsive to a comparison of the radiation dose applied to said surface with a standard value of the desired uniform application ion irradiation dose to be applied for controlling the focussing field intensity.

15. The apparatus defined in claim 14 wherein said means for varying the focussing field intensity includes means for modifying the intensity of the focussing field applied to said beam cyclically with time and with a cycling time which is short relative to the time for irradiation of said surface to said desired uniform application ion irradiation dose.

16. The apparatus defined in claim 7 wherein said means for generating said substantially monoenergetic beam of ions includes:
- an ion source for producing ions;
- means for extracting ions from said source by accelerating said ions extracted from said source;
- a magnetic dipole for separating the ions extracted from said source by ion mass to produce substantially monoenergetic ions; and
- means for accelerating the monoenergetic ions to form said ion beam.

* * * * *